US006628691B2

(12) United States Patent
Hatori

(10) Patent No.: US 6,628,691 B2
(45) Date of Patent: Sep. 30, 2003

(54) LASER DIODE

(75) Inventor: Nobuaki Hatori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 38 days.

(21) Appl. No.: 09/854,469

(22) Filed: May 15, 2001

(65) Prior Publication Data

US 2002/0085605 A1 Jul. 4, 2002

(30) Foreign Application Priority Data

Nov. 22, 2000 (JP) ........................... 2000-356008

(51) Int. Cl.⁷ .................. H01S 5/00; H01S 3/08
(52) U.S. Cl. ................ 372/50; 372/45; 372/96
(58) Field of Search ................ 372/45, 46, 50, 372/96

(56) References Cited

U.S. PATENT DOCUMENTS

| 4,905,253 | A | * | 2/1990 | Chraplyvy et al. | ........... | 372/96 |
| 4,964,134 | A | * | 10/1990 | Westbrook et al. | ........... | 372/45 |
| 5,712,865 | A | * | 1/1998 | Chow et al. | ........... | 372/96 |
| 5,754,341 | A | * | 5/1998 | Takata et al. | ........... | 359/569 |

FOREIGN PATENT DOCUMENTS

| JP | 03148889 A | * | 6/1991 | ............. | H01S/3/18 |
| JP | 9-326506 |   | 12/1997 |
| JP | 2000-58978 |   | 2/2000 |

* cited by examiner

Primary Examiner—Quyen Leung
(74) Attorney, Agent, or Firm—Armstrong, Westerman & Hattori, LLP

(57) ABSTRACT

A laser diode includes: a substrate having a first conductive type; a first cladding layer having a first conductive type and formed on the substrate; an active layer including a plurality of quantum dots and formed on the first cladding layer; a diffraction grating having a Bragg wavelength of $\lambda g$ and formed on the active layer; a second cladding layer having a second conductive type and formed on the active layer; a first electrode for injecting carriers having a first polarity into the active layer via the substrate; and a second electrode for injecting carriers having a second polarity into the active layer via the second cladding layer. The diffraction grating has a pitch satisfies the equation: $\Delta E \leq 1.1\Gamma$, where $\Gamma$ is the full width at half maximum (FWHM) of the gain spectrum of the active layer and $\Delta E$ is an amount of shift of an energy corresponding to the Bragg wavelength $\lambda g$ from the center wavelength energy of the gain spectrum.

10 Claims, 16 Drawing Sheets

LASER DIODE

BACKGROUND OF THE INVENTION

1. Field of the Invention

The present invention generally relates to an optical semiconductor device, and particularly relates to a laser diode having an optical resonator having a diffraction grating.

2. Description of the Related Art

In a fast optical communication network via optical fibers, a DFB (Distributed Feedback) laser diode or a DBR (Distributed Bragg Reflector) laser diode having an optical resonator having a diffraction grating is widely used as a single-mode light source which may be modulated by fast optical modulation.

The laser diode used as a light source for a fast optical communication network is required to operate in a single-mode. Therefore, a DFB laser diode or a DBR laser diode having an optical resonator having a diffraction grating instead of a mirror is commonly used as a light source for such fast optical communication network.

FIG. 1 shows a diagram illustrating a DFB laser diode 10 of the related art.

Referring to FIG. 1, the laser diode 10 is formed on an n-type InP substrate 11. A cladding layer 12 of n-type InP, an SCH (Separate Confinement Heterostructure) layer 13 of undoped InGaAsP, and an active layer 14 of undoped InGaAs are, in turn, epitaxially grown on the InP substrate 11.

A further SCH layer 15 of undoped InGaAsP is epitaxially grown on the active layer 14. A DFB diffraction grating 15A is formed on the SCH layer 15. Further, a cladding layer 16 of p-type InP and a contact layer 17 of P-type InP are in turn, epitaxially grown on the SCH layer 15. A p-type electrode 18 is disposed on the contact layer 17 and an n-type electrode 19 is disposed on a lower surface of the substrate 11.

With the laser diode 10 of the above-mentioned structure, the electrodes 18 and 19 serves to inject carriers into the active layer 14. Due to recombination caused by the injected carriers, an optical radiation is generated in the active layer 14. The optical radiation is guided though the SCH layers 13 and 15 and then optically amplified by stimulated emission in the active layer 14. Thereupon, an optical component tuned to an effective pitch of the diffraction grating 15A, or, having a wavelength within the range of the Bragg wavelength to the DBF wavelength λg of the diffraction grating 15A is repeatedly reflected by the DFB diffraction grating 15A and is selectively amplified.

However, there is a certain drawback when such a single-mode laser diode is driven by a modulation signal. Since the modulation signal alters the density of the injected carriers in the active layer 14 and thus the refractive index of the active layer, the effective period of the diffraction grating is also altered, and thus it can be said that the oscillation wavelength is altered simultaneous with the modulation signal. This effect is commonly referred to as chirping. Such chirping may cause the wavelength of an optical signal to shift from the optimum transmission band for the optical fibers, so that the transmission distance of the optical signal may be limited.

The magnitude of chirping is determined by a line-width enhancement factor α, which is generally defined by an equation:

$$\alpha = \frac{\partial[\text{Re}\{\chi(N)\}]/\partial N}{\partial[\text{Im}\{\chi(N)\}]/\partial N}, \quad (1)$$

where $\chi(N)$ is a complex susceptibility of the active layer of the laser diode, N is a carrier density, $\text{Re}\{\chi(N)\}$ is the real part of $\chi(N)$, and $\text{Im}\{\chi(N)\}$ is the imaginary part of $\chi(N)$. $\text{Re}\{\chi(N)\}$ relates to a refractive index of the active layer and $\text{Im}\{\chi(N)\}$ relates to an absorption of the active layer.

Given that a well-known Kramers-Kronig relationship holds between $\text{Re}\{\chi(N)\}$ and $\text{Im}\{\chi(N)\}$ and that $\text{Im}\{\chi(N)\}$ is proportional to the gain g of the laser diode, the line-width enhancement factor α may also be represented by an equation:

$$\alpha(E, N) = -P \int_{-\infty}^{\infty} \frac{\partial g(E', N)/\partial N}{E' - E} dE'/\partial g(E', N)/\partial N, \quad (2)$$

where E and E' represent energies and P is Cauchy's principal value.

With a typical laser diode 10 having the active layer 14 of a bulk structure, the line-width enhancement factor α is generally of an order of 4 to 6 and therefore cannot avoid a substantial chirping effect due to the modulation signals. Whereas with a laser diode having a quantum well layer in the active layer 14 with the SCH layer 15 serving as a barrier layer, the value of the line-width enhancement factor α may be decreased to about 2. With such a quantum well laser diode, by optimizing the material and composition of the quantum well and the laser structure and by combining with the DFB optical resonator, the value of the line-width enhancement factor α may be decreased to about 1.4 to 1.8.

FIG. 2 is a graph showing a relationship between the gain and the line-width enhancement factor of the laser diode of FIG. 1. Referring to FIG. 2, it can be seen that a wavelength at maximum gain is offset from a wavelength where the line-width enhancement factor α is zero and thus the gain is negative at the wavelength where the line-width enhancement factor a is zero. Accordingly, with the quantum well laser diode of the relate art, the material and the composition of quantum wells and the pitch of the DFB diffraction grating 15 are determined such that the laser oscillates at a wavelength where the gain spectrum is positive and the line-width enhancement factor α is as close as possible to zero. However, with such a process, chirping can only be reduced to a limited extent and it is not possible to obtain sufficient gain.

Also, it is known to modify the laser diode of FIG. 1 by providing the active layer 14 of quantum dots. See, for example, Japanese laid-open patent application No. 9-326506.

FIG. 3 is a diagram illustrating a DFB laser diode 20 of the related art in which quantum dots are used as an active layer.

Referring to FIG. 3, the laser diode 20 is formed on a (001) surface of an n-type GaAs substrate 21. The laser diode 20 includes a cladding layer 22 of n-type AlGaAs having a composition of $Al_{0.4}Ga_{0.6}As$ which is epitaxially grown on the substrate 21, an SCH layer 23 of undoped GaAs which is formed on the cladding layer 22 a cladding layer 24 of p-type AlGaAs having a composition of $Al_{0.4}Ga_{0.6}As$ which is formed on the SCH layer 23 and a contact layer 25 of P-type GaAs formed on the cladding layer 24. Further, an active layer constituted by a plurality of quantum dots 23A is formed in the SCH layer 23. Further, a diffraction grating 23B is formed on the SCH layer 23 in a direction of axis of the laser diode 20. A p-type electrode 26 is disposed on the contact layer 25 and an n-type electrode 27 is disposed on a lower surface of the substrate 21.

With such laser diode 20 using quantum dots, it is expected that, if the zero point of the line-width enhancement factor α is close to the peak of the gain spectrum, chirping can be effectively reduced.

FIG. 4 is a graph showing a relationship between the optical gain and the wavelength for a DFB laser diode. Again spectrum of the laser diode 20 having quantum dots has a thermal dependency of about 0.25 nm/° C., and as can be seen from the graph of FIG. 4, the gain spectrum shifts towards longer wavelength side when there is an increase of the temperature of the laser diode. On the contrary, the Bragg wavelength of the DFB diffraction grating 23B has a thermal dependency of only about 0.1 nm/° C. Therefore, with the quantum dot DFB laser diode 20 of the related art, there is a drawback that the change in operation temperature may cause the Bragg wavelength of the DFB diffraction grating 23B to shift out of the gain spectrum, which ceases the laser oscillation.

SUMMARY OF THE INVENTION

Accordingly, it is a general object of the present invention to provide a novel and useful optical semiconductor device which can overcome the above drawback.

It is another and more specific object of the present invention to provide a laser diode in which an absolute value of the line-width enhancement factor is minimized and the range of operating temperature is extended.

In order to achieve the above objects according to the present invention, a laser diode includes:

- a substrate having a first conductive type;
- a first cladding layer having a first conductive type and formed on the substrate;
- an active layer including a plurality of quantum dots and formed on the first cladding layer;
- a diffraction grating having a Bragg wavelength of $\lambda g$ and formed on the active layer;
- a second cladding layer having a second conductive type and formed on the active layer;
- a first electrode for injecting carriers having a first polarity into the active layer via the substrate; and
- a second electrode for injecting carriers having a second polarity into the active layer via the second cladding layer,
- wherein the diffraction grating has a pitch satisfying the following equation:

$$\Delta E \leq 1.1\Gamma$$

where $\Gamma$ is the full width at half maximum (FWHM) of the gain spectrum of the active layer and $\Delta E$ an amount of shift of an energy corresponding to the Bragg wavelength $\lambda g$ from the center wavelength energy of the gain spectrum. According to the present invention, the absolute value of the line-width enhancement factor α of the active layer can be restricted to a value less than or equal to 4.

Further, according to the present invention, a laser diode having an active layer including quantum dots and a photoresonator having a diffraction grating, the Bragg wavelength of the diffraction grating is determined to be within a predetermined energy width which is determined corresponding to the gain spectrum of the active layer, so that the line-width enhancement factor may be restricted within a required range that can be selected arbitrarily, and thus the chirping of the laser diode is reduced. Also, since the quantum dots are self-organized quantum dots, even if there is a detuning between the gain spectrum of the active layer and a Bragg wavelength of the diffraction grating due to a change of operating temperature of the laser diode, the Bragg wavelength remains within the range of the gain spectrum due to the broadening of the gain spectrum, and thus the laser diode remains oscillating.

Other objects and further features of the present invention will be apparent from the following detailed description when read in conjunction with the accompanying drawings.

DETAILED DESCRIPTION OF THE PREFERRED EMBODIMENTS

In the following, principles and embodiments of the present invention will be described with reference to the accompanying drawings.

Figure 1:
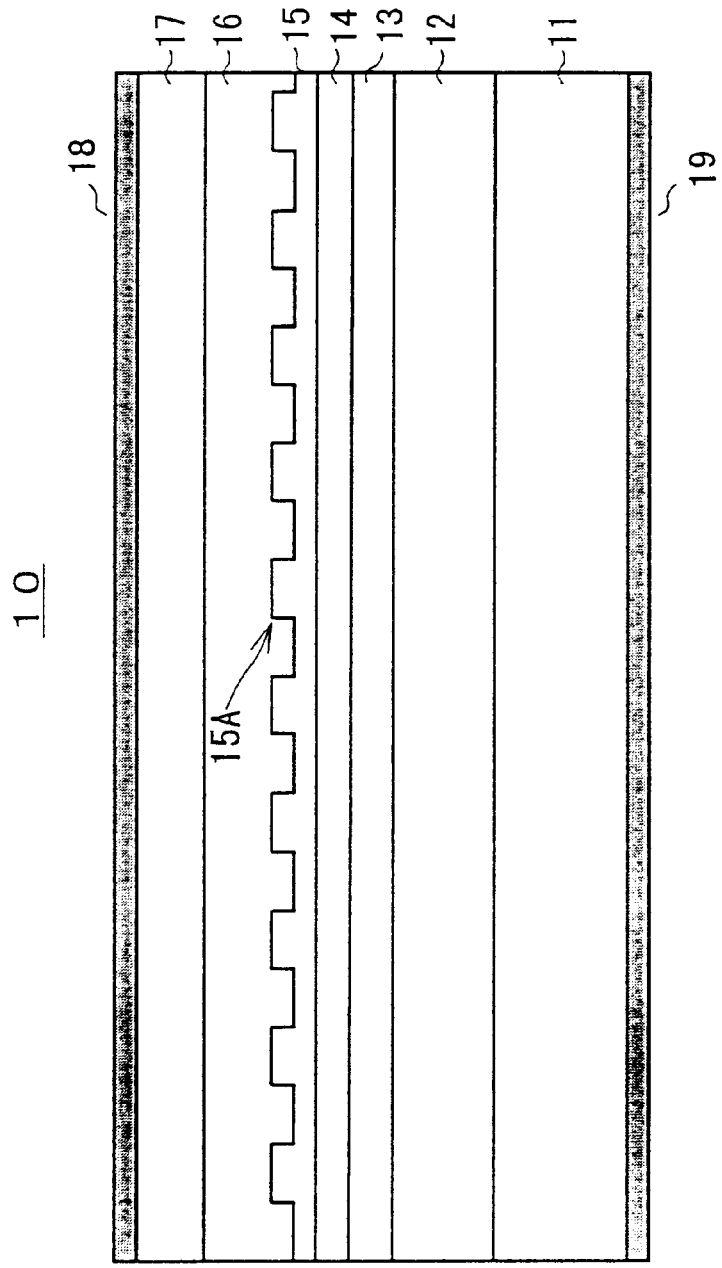
FIG. 1 is a diagram illustrating a DFB laser diode of the related art.
Figure 2:
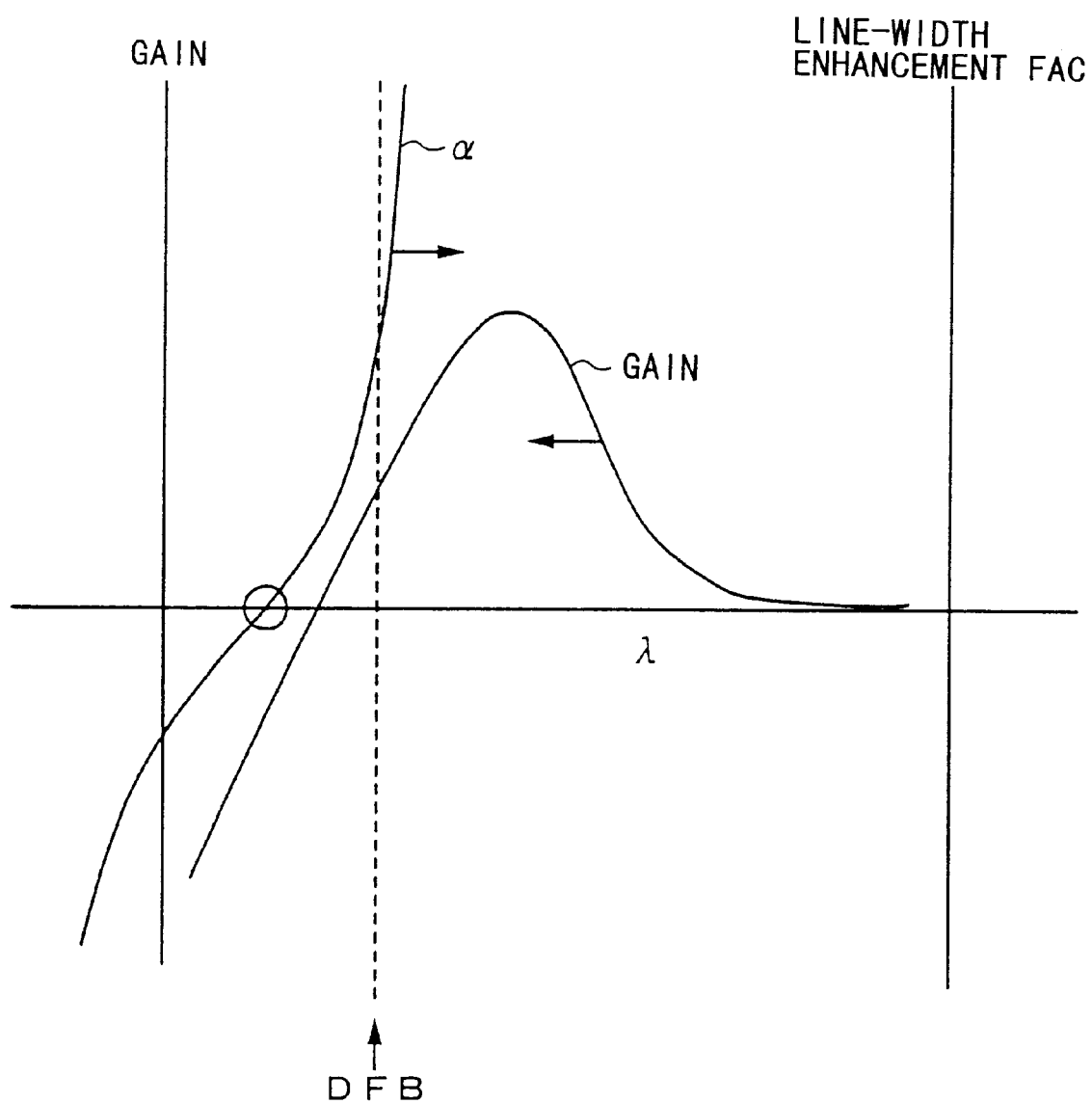
FIG. 2 is a graph showing a relationship between the gain and the line-width enhancement factor of the laser diode of FIG. 1.
Figure 3:
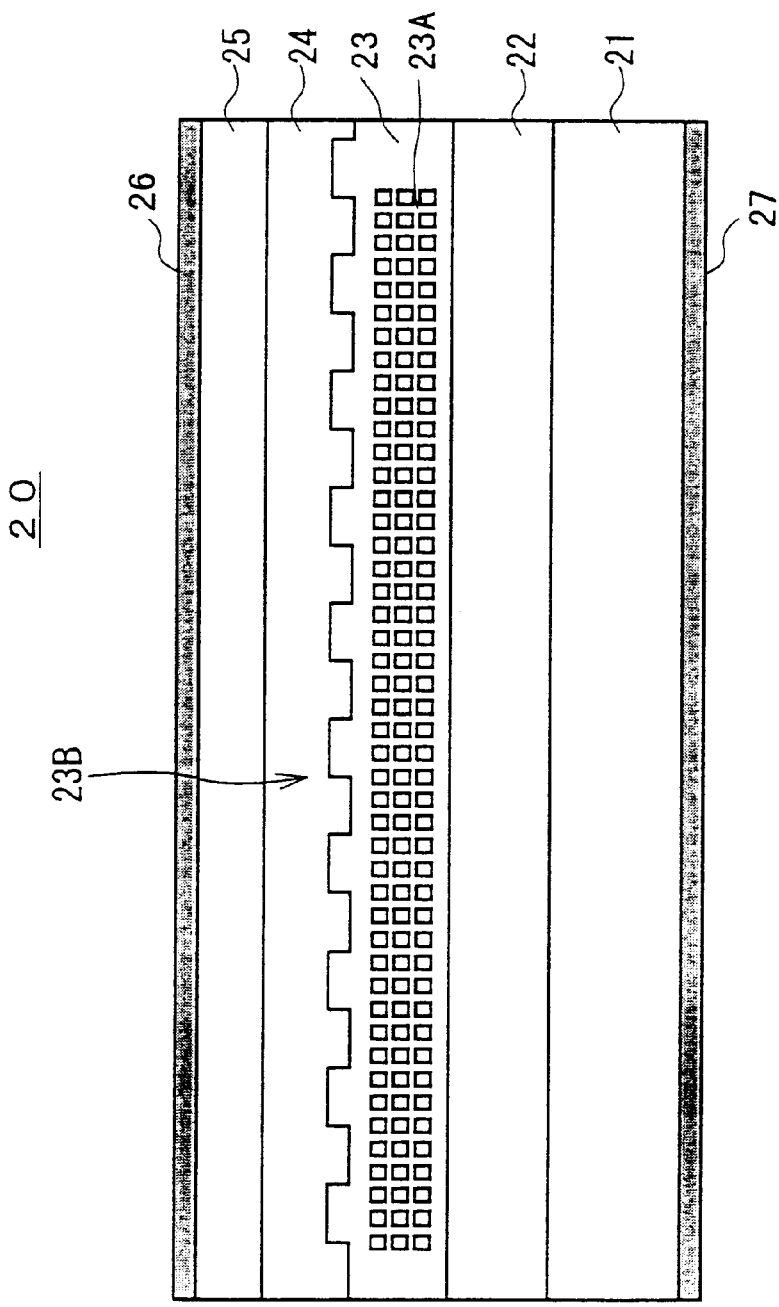
FIG. 3 is a diagram illustrating a DFB laser diode of the related art in which quantum dots are used as an active layer.
Figure 4:
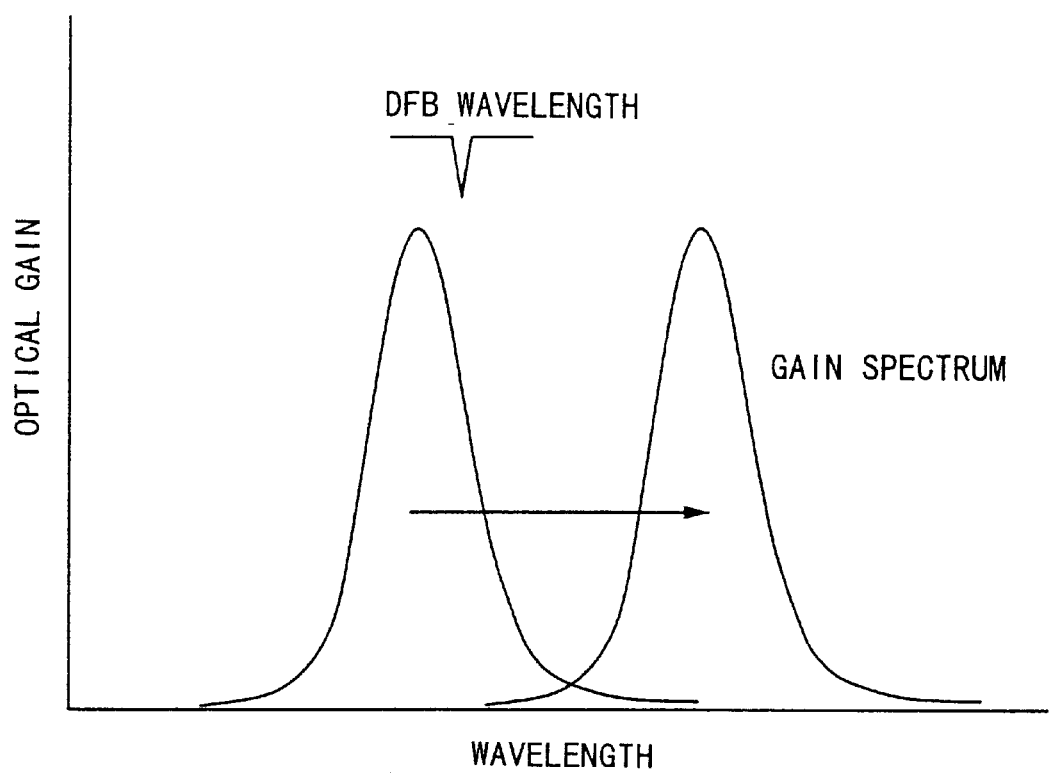
FIG. 4 is a graph showing a relationship between the optical gain and the wavelength for a DFB laser diode.
Figure 5:
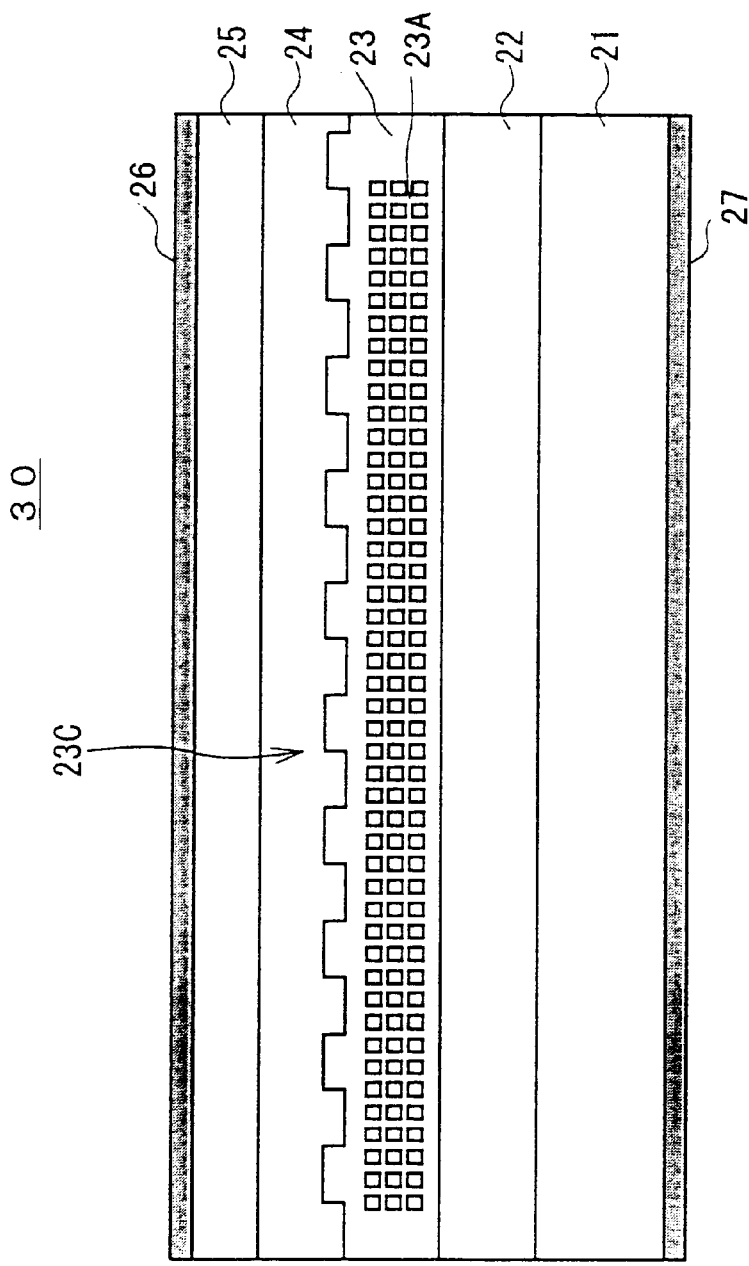
FIG. 5 is a diagram illustrating a DFB laser diode of a first embodiment of the present invention.

FIG. 5 is a diagram illustrating a DFB laser diode 30 of a first embodiment of the present invention. In FIG. 5, those elements described above are accompanied by same reference numerals and will not be explained in detail.

Referring to FIG. 5, the DFB laser diode 30 has a structure similar to that of the DFB laser diode 20 of the related art except that a different diffraction grating 23 C having a pitch and the Bragg wavelength λg that differ from those of the diffraction grating 23B is provided on the SCH layer 23. In a similar manner to the laser diode 20 of the related art, the active layer of the laser diode 30 is made of quantum dots 23A formed in the SCH layer 23.

Figure 6:
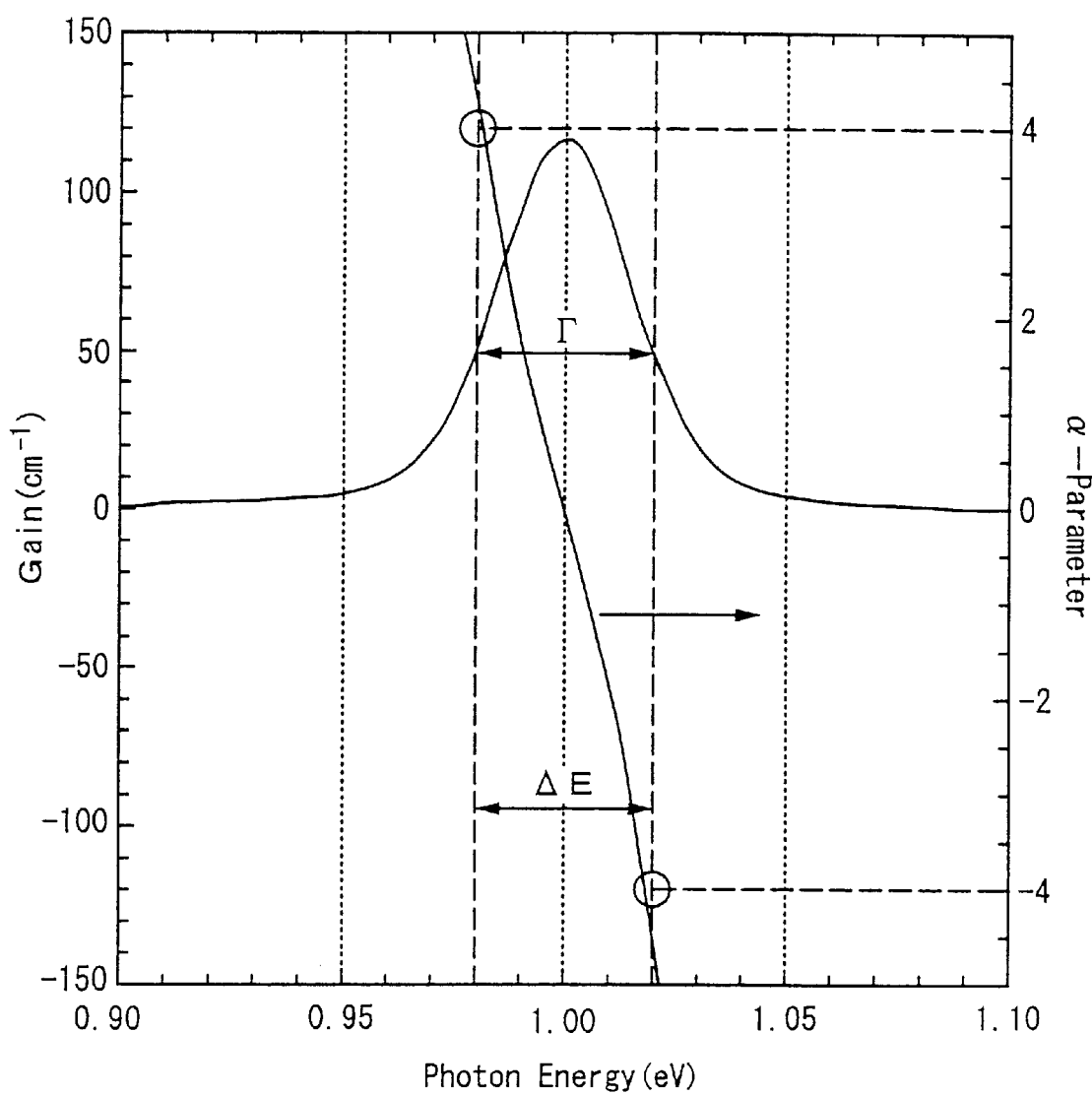
FIG. 6 is graph showing computation results of a line-width enhancement factor a and a gain spectrum for the DBF laser diode of FIG. 5.

FIG. 6 is graph showing computation results of a line-width enhancement factor α and a gain spectrum for the DBF laser diode 30 of FIG. 5. In FIG. 6, a horizontal axis represents the optical-wavelength energy, a left vertical axis represents the gain and a right vertical axis represents the line-width enhancement factor α. In FIG. 6, the gain spectrum of the quantum dots has been calculated using the equations described in Sugawara, M., "Self-Assembled InGaAs/GaAs Quantum Dots," chapter 1, Academic Press, taking into account an energy width of a single quantum dot (uniform width) and an energy width due to size variation of the quantum dots (non-uniform width). In an example shown in FIG. 6, the uniform width is set to 10 meV and the non-uniform width is set to 30 meV. It can be seen that the obtained rain spectrum has a FWHM (full width at half maximum) Γ of 36 meV. The line-width enhancement factor α of FIG. 6 is derived from equation (2).

As can be seen from FIG. 6, the peak of the gain spectrum and the zero point of the matches for the DFB laser diode 30 having quantum dots in the active layer. This implies that for any absolute value of the line-width enhancement factor α, such as less than or equal to 4, less than or equal to 2, less than or equal to 1.4 and less than or equal to 1.0, the peak of the gain spectrum exists within the corresponding energy width.

For example, when the absolute value of the line-width enhancement factor α is less than or equal to 4, the corresponding optical wavelength domain energy width ΔE is about 38 meV. Accordingly, for the laser diode 30 of the present embodiment, when the Bragg wavelength λg of the diffraction grating 23C is kept within the above-mentioned energy width ΔE, the line-width enhancement factor α having an absolute value of less than or equal to 4.0 is guaranteed. Since the energy width ΔE is within the gain spectrum, chirping can be effectively reduced with the thus-designed DFB laser diode.

Further, for FIG. 6, the absolute value of the line-width enhancement factor α may be selected to be in any range, such as less than or equal to 2.0, less than or equal to 1.4 and less than or equal to 1.0. In this case, given that the FWHM of the gain spectrum is 36 meV, the corresponding energy width ΔE will be about 22 meV, 18 meV and 12 meV, respectively. Accordingly, when the Bragg wavelength λg of the diffraction grating 23C is set such that the corresponding Bragg wavelength energy is within the above-mentioned energy width, a desired line-width enhancement factor α can be achieved. As a result, chirping can be reduced in a more effective manner.

Figure 7:
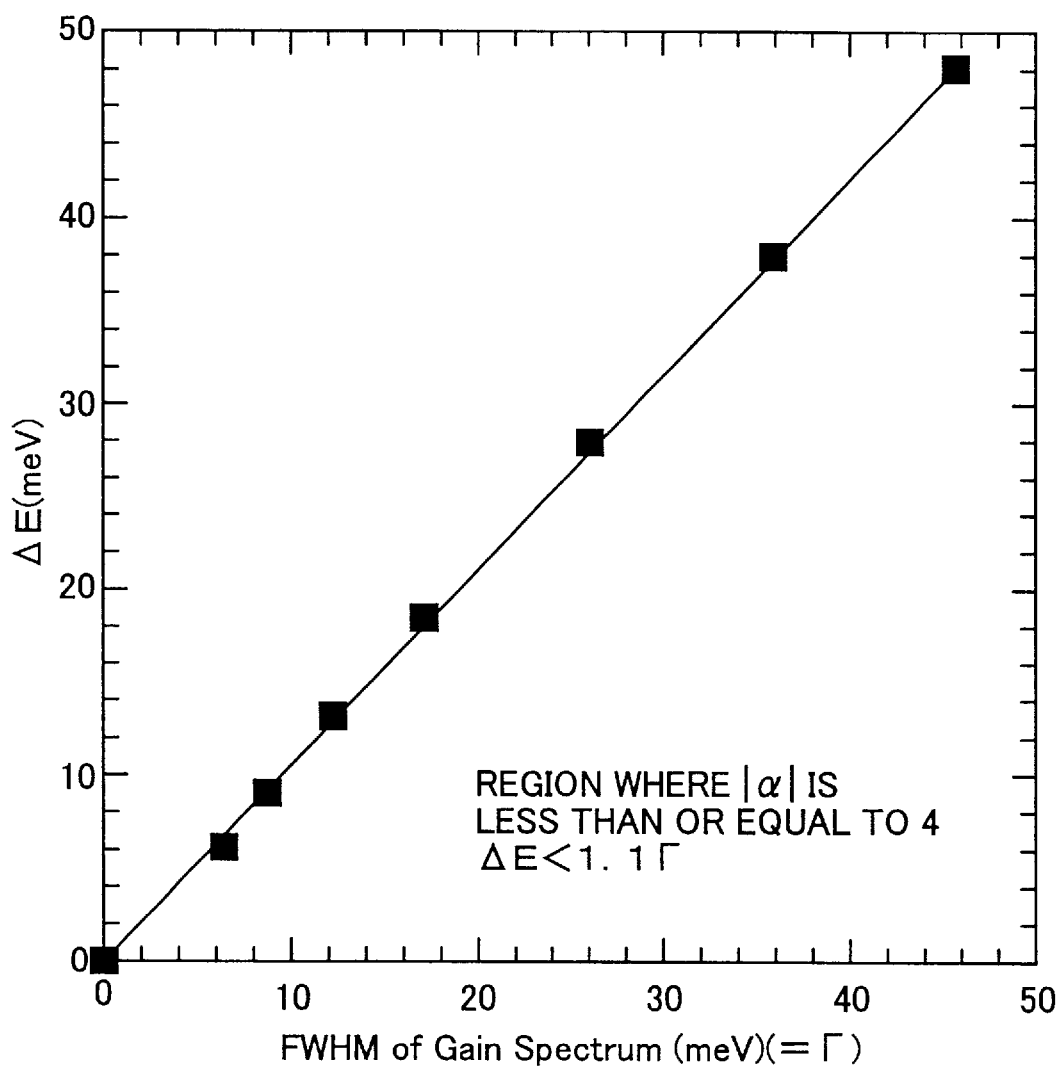
FIG. 7 shows a graph of a relationship between the energy width $\Delta E$ and the FWHM to show an example of a design of the diffraction grating pattern for the DFB laser diode of FIG. 5.

Further, the inventors have applied the calculation of FIG. 6 to various line-width enhancement factor α and FWHM Γ, and found that, when the line-width enhancement factor α is less than or equal to 4.0, the relationship between the energy width ΔE and FWHM Γ can be approximately represented by a straight line ΔE=1.1Γ as shown in FIG. 7. In FIG. 7, the vertical axis represents the energy width ΔE and the horizontal axis represents the FWHM Γ of the gain spectrum.

Referring to FIG. 7, a hatched region under the line ΔE=1.1Γ represents a region satisfying a condition that the line-width enhancement factor α is less than or equal to 4.0. With the DFB laser diode 30 of FIG. 5, it can be seen that by setting the pitch of the diffraction grating 32C which gives the value of ΔE within the hatched region for a gain spectrum of a given FWHM, the absolute value of the line-width enhancement factor α is limited to less than or equal to 4.0. As has been described above, even when the pitch of the diffraction grading 23C is set in such a manner, the Bragg wavelength still remains in the gain spectrum of the laser diode, and therefore the laser diode will oscillate. When the FWHM of the above-described gain spectrum takes a greater value, that is to say when the gain spectrum of FIG. 6 is broader, the energy region ΔE becomes greater. Whereas when the gain spectrum of FIG. 6 is sharp, the energy region ΔE becomes smaller.

Figure 8:
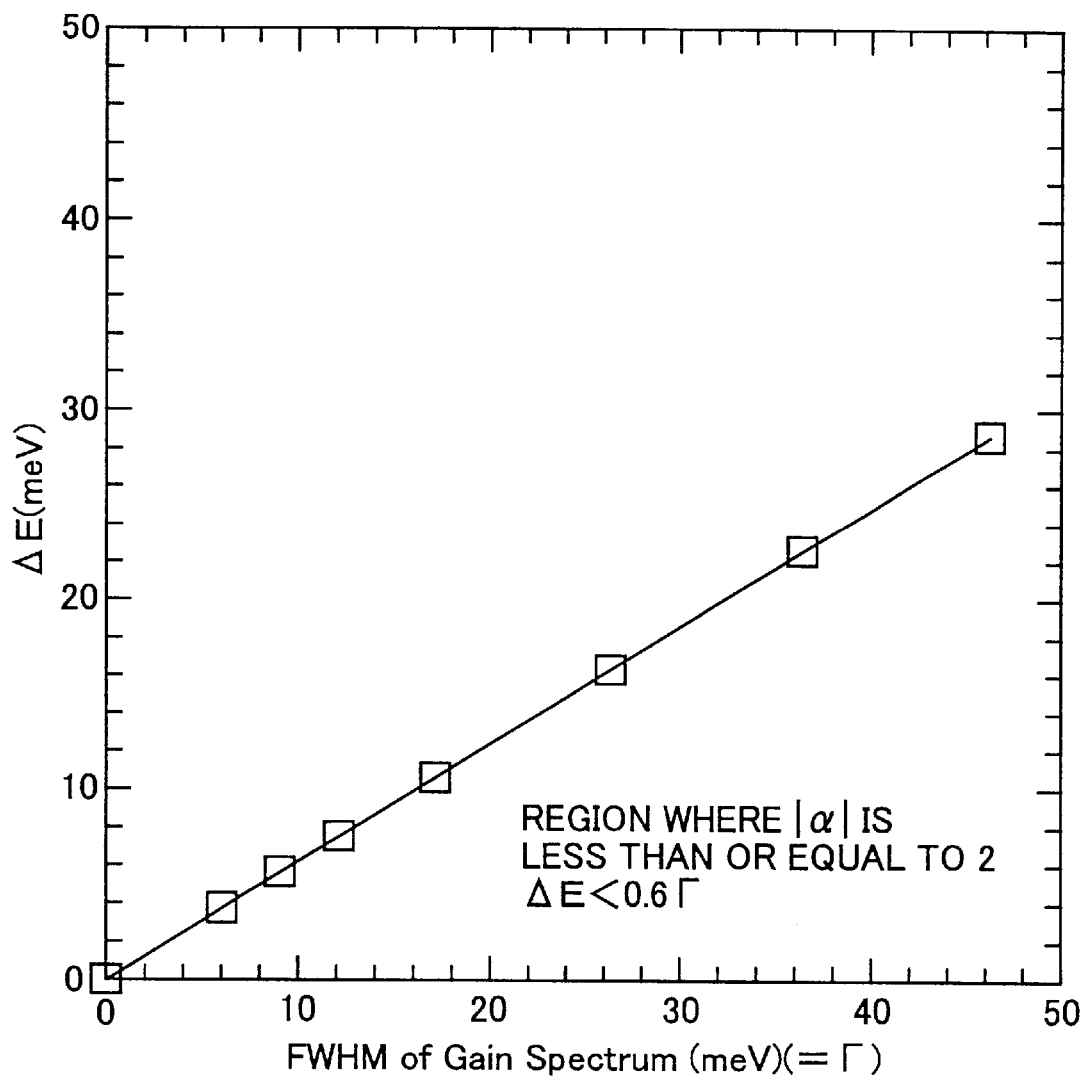
FIG. 8 shows a graph similar to FIG. 7 to show another example of a design of the diffraction grating pattern for the DFB laser diode of FIG. 5.
Figure 9:
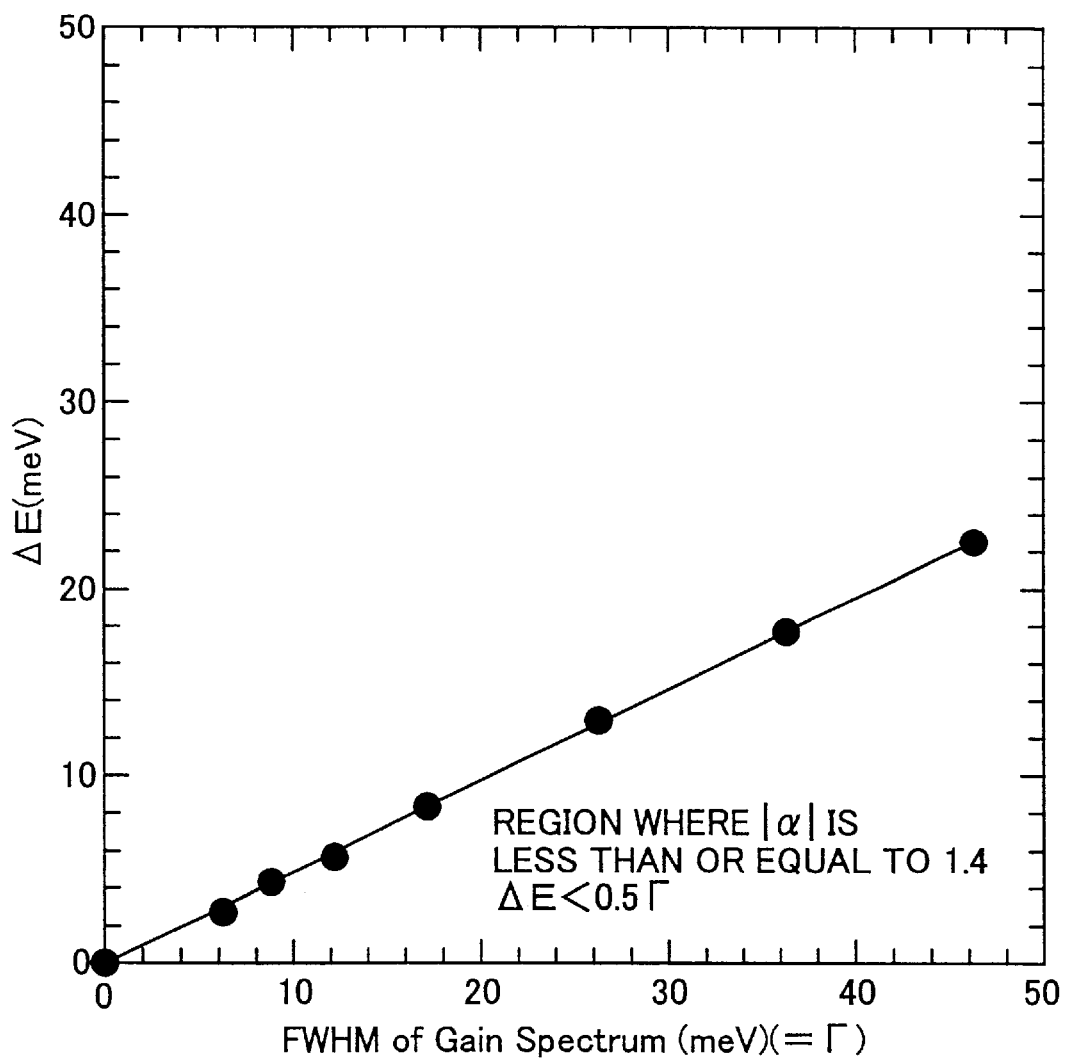
FIG. 9 shows a graph similar to FIG. 7 to show still another example of a design of the diffraction grating pattern for the DFB laser diode of FIG. 5.

When it is desired to restrict the absolute value of the line-width enhancement factor α to less than or equal to 2.0, a similar calculation gives a graph shown in FIG. 8 from which it can be seen that the wavelength of the diffraction grating 23C may be set to lie in an energy region under a straight line represented by an equation ΔE=0.6Γ. Further, when it is desired to restrict the absolute value of the line-width enhancement factor α to less than or equal to 1.4, a similar calculation gives a graph shown in FIG. 9 from which it can be seen that the wavelength of the diffraction grating 23C may be set to lie in an energy region under a straight line represented by an equation ΔE=0.5Γ. Also, when it is desired to restrict the absolute value of the line-width enhancement factor α to less than or equal to 1.0, a similar calculation gives a graph shown in FIG. 9 from which it can be seen that the wavelength of the diffraction grating 23C may be set to lie in an energy region under a straight line represented by an equation ΔE=0.3Γ.

Now, as has been described above, for the laser diode 30 having the quantum dots of FIG. 5, when there is an increase of an operational temperature, the gain spectrum shifts towards longer wavelength side at a rate of 0.25 nm/° C. However, since the Bragg wavelength λg that correspond to the diffraction grating 23C only varies at a rate of 0.1 nm/° C., a detuning occurs between the diffraction grating 23C and the gain spectrum when there is a temperature change.

When amount of detuning against temperature change ΔT is defined as ΔD, from the above relationship, ΔD can be expressed as:

$$\Delta D \text{ (nm)} = 0.25\Delta T - 0.1\Delta T = 0.15\Delta T \quad (3)$$

Figure 11:
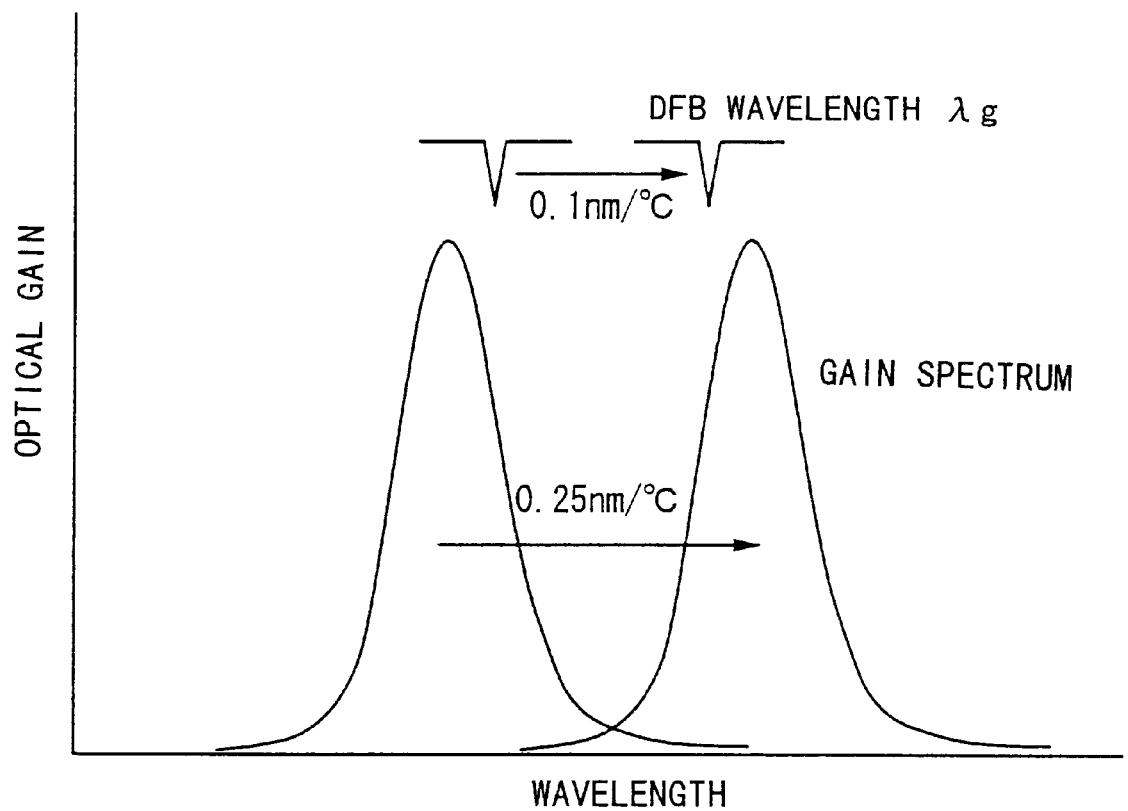
FIG. 11 is a diagram showing how a gain spectrum is shifted due to a temperature change of the DFB laser diode.

Accordingly, in order to keep the laser oscillating even if there is detuning, the quantum dot active layer 23A must have an extent corresponding to the amount of detuning ΔD. For example, in order to keep the laser oscillating when the operating temperature varies in the range of 80° C., the gain spectrum of the active layer 23A must have the FWHM of 12 nm. When the gain spectrum has such FWHM, even if the gain spectrum shift as shown in FIG. 11, the Bragg wavelength of the diffraction grating 23B lies within the range of the gain spectrum. When converted into energy, the width of 12 nm corresponds to a width of about 9 meV in the 1.3 μm band and corresponds to a width of about 6 meV in the 1.55 μm band. The FWHM of the gain spectrum may be regarded as the same as a width of an emission spectrum of the active layer 23A.

Figure 12:
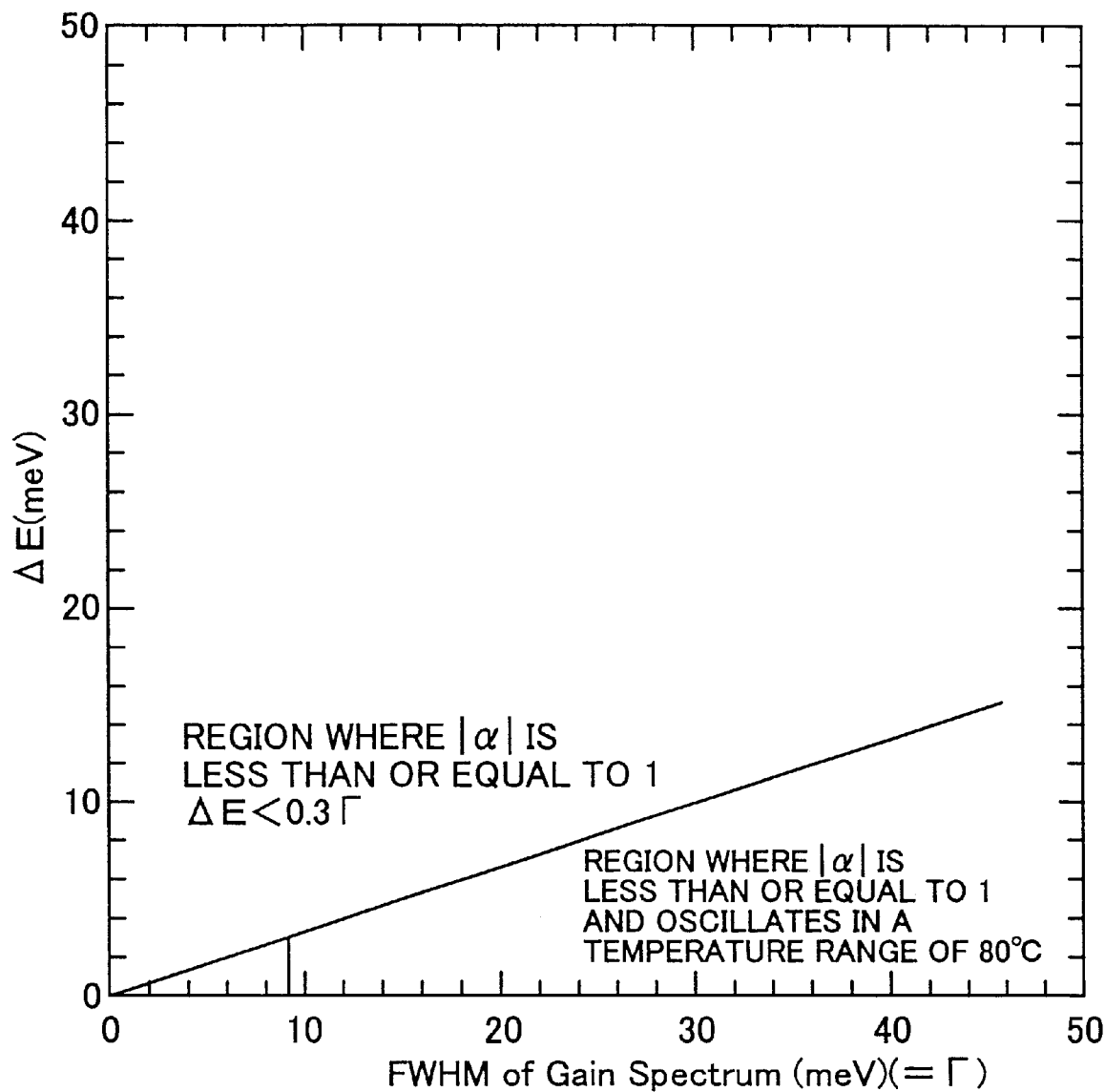
FIG. 12 shows a graph of a relationship between the energy width $\Delta E$ and the FWHM to show an example of a design of the diffraction grating pattern for the DFB laser diode of FIG. 5, taking the temperature change into consideration.

FIG. 12 shows a graph of a relationship between the energy width ΔE and the FWHM Γ for the DFB laser diode of FIG. 5, where the laser is kept oscillating even when the absolute value of the line-width enhancement factor α is less than or equal to 1.0 and there is a temperature change ΔT of 80° C.

Figure 10:
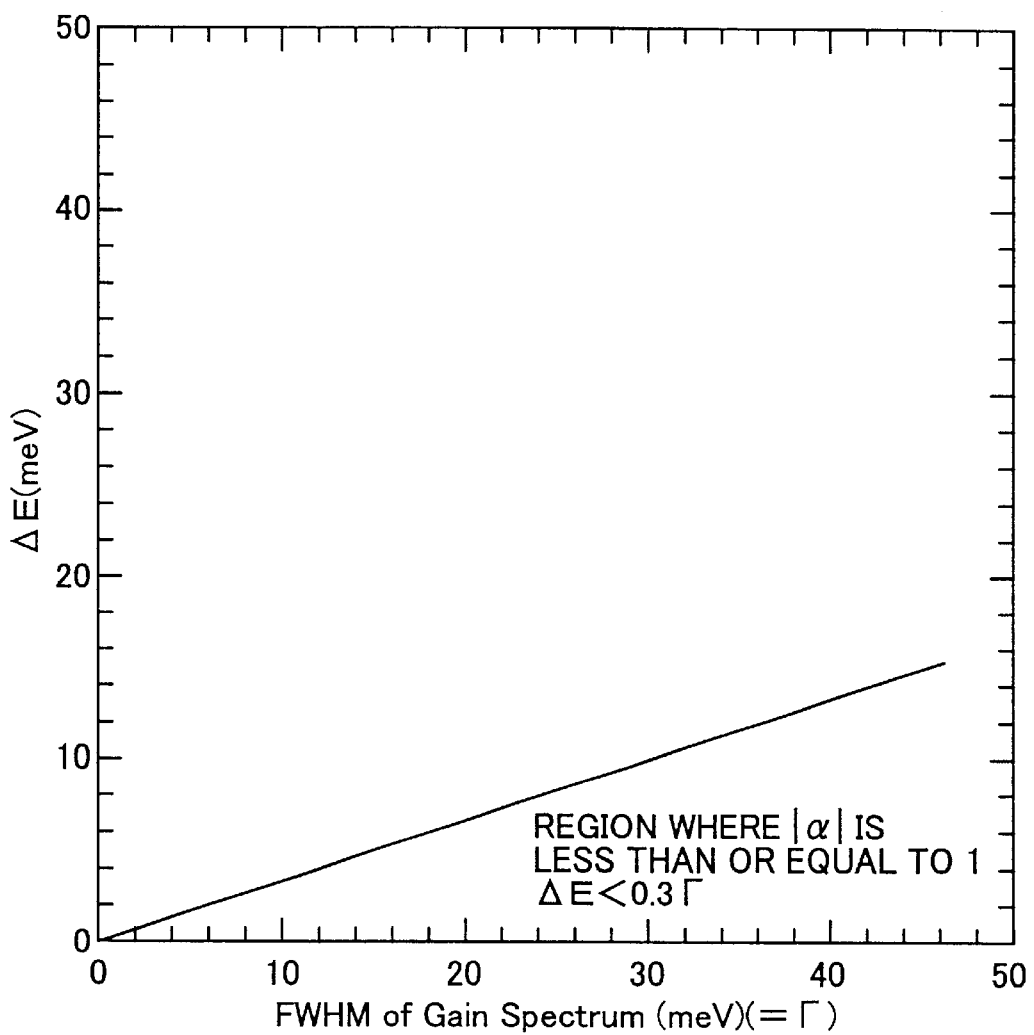
FIG. 10 shows a graph similar to FIG. 7 to show a further example of a design of the diffraction grating pattern for the DFB laser diode of FIG. 5.

The graph of FIG. 12 basically corresponds to the graph of FIG. 10, except that there is no lower limit for the FWHM Γ of the gain spectrum. That is to say, by setting the FWHM Γ of the gain spectrum to a value greater than 9 meV, even when there is a temperature change ΔT of 80° C., the Bragg wavelength λg of the diffraction grating 23C lies within the range of the FWHM Γ the gain spectrum, and therefore the laser is kept oscillating. Also, when the Bragg wavelength λg of the diffraction grating 23C is set such that the Bragg wavelength energy lies within the energy width ΔE defined by a straight line ΔE=0.3Γ, the absolute value of the line-width enhancement factor α can be restricted to a value of less than or equal to 1.0.

Referring now to FIGS. 13A to 14F, a method of manufacturing the laser diode 30 of FIG. 5 will be described.

Figure 13A:
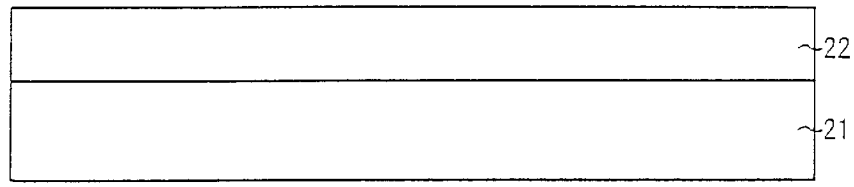
FIGS. 13A to 13C are diagrams showing various steps of a DFB laser diode manufacturing process.

As shown in FIG. 13A, an AlGaAs cladding layer 22 having a composition of $Al_{0.4}Ga_{0.6}As$ is formed on the (001) surface of the n-type GaAs substrate 21. The cladding layer 22 is formed by an MBE (Molecular Beam Epitaxy) method and has a thickness of about 100 nm. As shown in a step of FIG. 13B, an undoped GaAs SCH layer 23A is formed on the cladding layer 22. The SCH layer is also formed by a MBE method and has a thickness of several nanometers (nms).

Figure 13B:
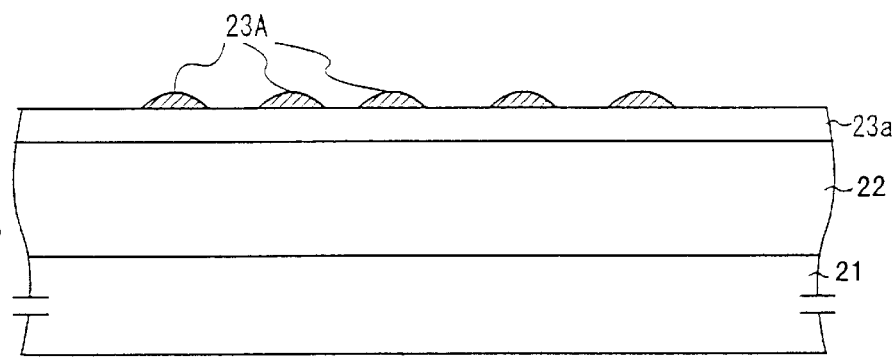

Also in the step shown in FIG. 13B, the substrate temperature is set at 510° C. and an InAs layer is formed on the SCH layer 23a by a MBE method at a deposition rate of about 0.001 molecular layer/second with the thickness of about 1.8 molecular layer. The InAs layer forms a strained-hetero epitaxial system on the GaAs substrate 21 and thus island-like self-organized quantum dots 23A are formed. The quantum dots 23A generally has a diameter of an order of several nanometers (nms) to several tens of nanometers (nms) and a height of an order of several nanometers (nms). Although the quantum dots 23A has natural size non-uniformity, a gain spectrum having a FWHM of about 40 meV can be achieved by selecting a comparatively reduced growth rate.

Figure 13C:
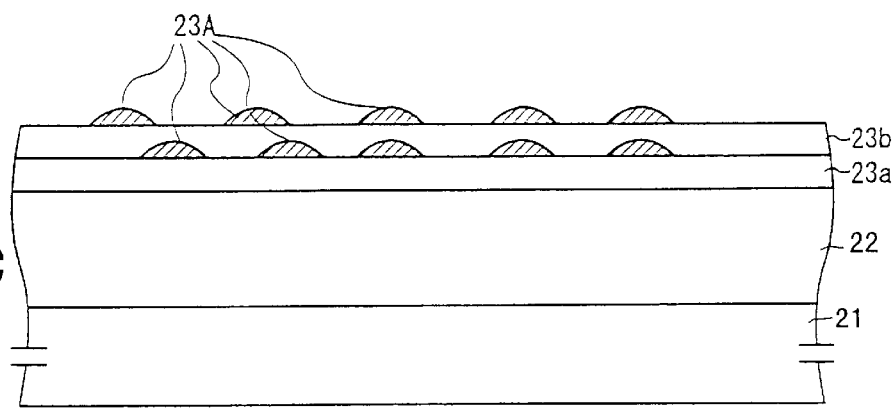

Further, in the step shown in FIG. 13C, an SCH layer 23b having a thickness of an order of several nanometers (nms) is formed by an MBE method such that the SCH layer 23b covers the structure of FIG. 13B. Then, further self-organized quantum dots 23A similar to those shown in FIG. 13B are formed under the same condition as for those shown in FIG. 13B. Further, the step shown in FIG. 13C is repeated to provide a structure shown in FIG. 14D, in which an active layer is formed as an aggregation of self-organized InAs quantum dots 23A within the SCH layer 23.

Figure 14D:
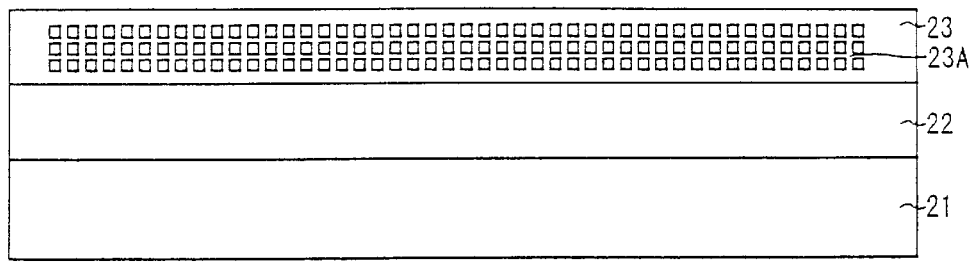
FIGS. 14D to 14F are diagrams showing further steps of a DFB laser diode manufacturing process.

In the step shown in FIG. 14D, the gain spectrum of the quantum dot active layer 23A is obtained by observing the emission spectrum. Then, the pitch of the diffraction grating 23C is determined based on the FWHM of the obtained gain spectrum and the value of the desired line-width enhancement factor α. In the step shown in FIG. 14E, the SCH layer 23 is patterned based on the determined pitch, so as to provide the diffraction grating 23C. For example, when it is required to restrict the absolute value of the line-width enhancement factor α to a value less than or equal to 1.0, using the above-mentioned equation ΔE=0.3Γ (FIG. 10), the pitch of the diffraction grating 23C is determined such that the Bragg wavelength is within ΔE=12 meV.

Figure 14E:
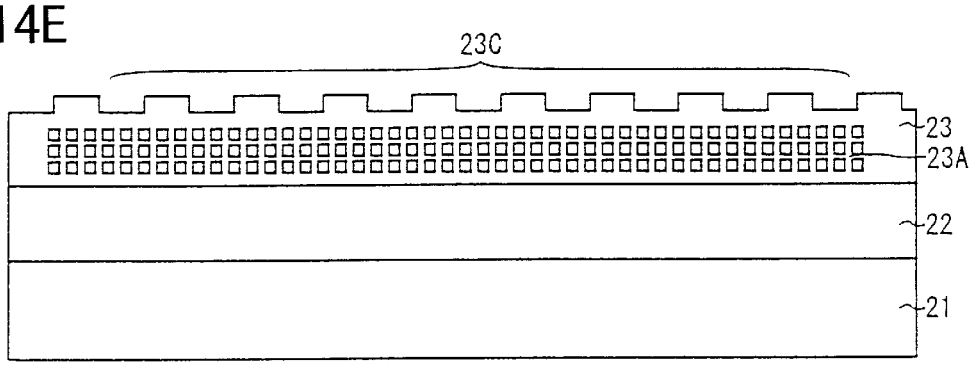
Figure 14F:
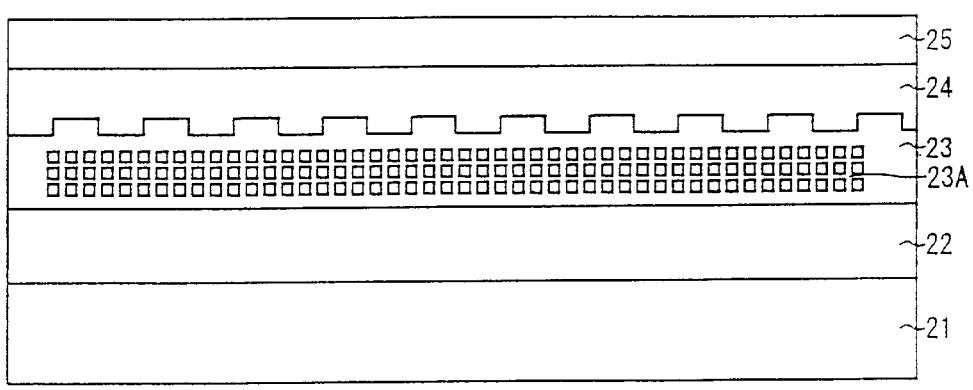

In the step shown in FIG. 14F, ap-type cladding layer 24 having a composition of $Al_{0.4}Ga_{0.6}As$ is deposited on the structure of FIG. 14E by an MBE method such that the cladding layer 24 covers the diffraction grating 23C. Further, a p-type GaAs contact layer 25 is formed thereon by an MBE method. Then, a ridge structure, not shown, is formed on the structure of FIG. 14F by a mesa etching process, so as to form the p-type electrode 26 and the n-type electrode 27. Finally, the DFB laser diode 30 shown in FIG. 5 is obtained.

Accordingly, with the DFB laser diode 30 of FIG. 30, the gain spectrum of the quantum dot active layer 23A can be controlled to a certain extent when the deposition rate of InAs is controlled in the steps of forming the InAs quantum dots 23A shown in FIGS. 13B and 13C. For example, in the steps of FIGS. 13B and 13C, when the deposition rate of the InAs layer is set to 0.1 molecular layer/second, a gain spectrum having a FWHM of about 100 meV can be obtained. In this case, if it is required to reduce the absolute value of the line-width enhancement factor α to a value less than or equal to 1.0, the pitch of the diffraction grating 23C may be set in the step of FIG. 14E such that the Bragg wavelength energy of the diffraction grating 23C is within the range of ΔE=0.3 meV.

The FWHM of the gain spectrum of the thus-formed quantum dot active layer 23A exceeds 9 meV or 6 meV which have been explained with reference to FIG. 12. Therefore, even if there is a temperature change ΔT of 80° C. during an operation at 1.3 μm or 1.55 μm, the laser oscillation will not cease.

Figure 15:
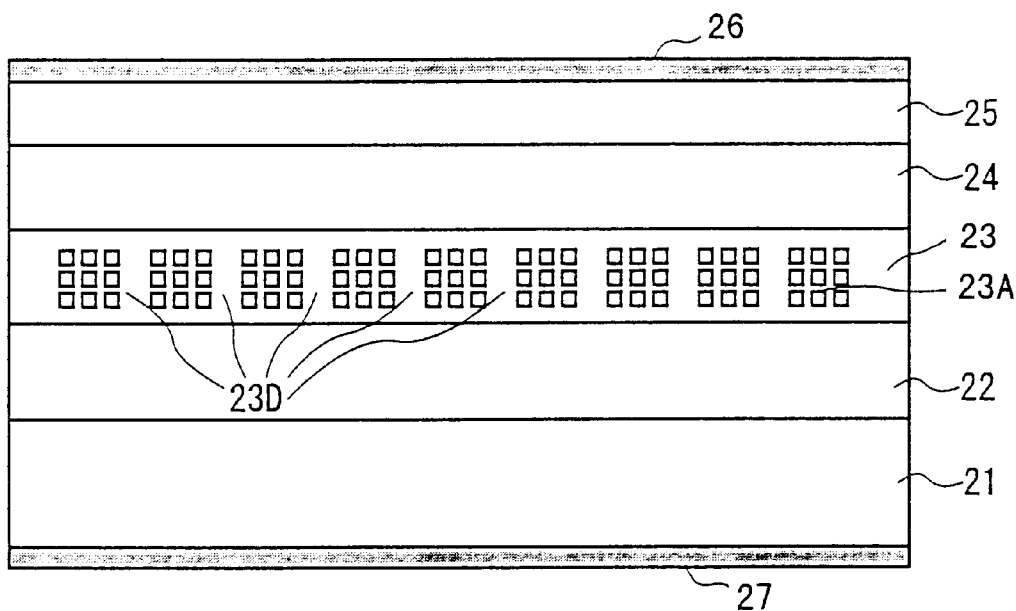
FIG. 15 is a diagram illustrating a DFB laser diode of a second embodiment of the present invention.

FIG. 15 is a diagram illustrating a DFB laser diode 40 of a second embodiment of the present invention. In FIG. 15, those elements described above are accompanied by same reference numerals and will not be explained in detail.

In the present embodiment, the active layer is again formed by the self-organized quantum dots 23A. However, instead of the diffraction grating 23C formed on the SCH 23 as in the laser diode 30, the laser diode 40 of the present embodiment is provided with a diffraction grating 23D which is formed within the self-organized quantum dot active layer 23A.

In the present embodiment, it is also possible to realize a required line-width enhancement factor. This may be implemented by setting the Bragg wavelength energy to be within a predetermined energy width ΔE that is determined for the FWHM Γ of the gain spectrum of the self-organized quantum dot active layer 23A. For example, when the pitch of the diffraction grating 23D is set such that the Bragg wavelength energy is within the energy width of ΔE=0.3Γ, the absolute value of the line-width enhancement factor α may be restricted to a value less than or equal to 1.0.

Again, in the present embodiment, when the quantum dots 23A are formed such that the value of the FWHM is greater than 6 meV or 9 meV, a stable laser oscillation can be achieved for a temperature change of 80° C.

Figure 16:
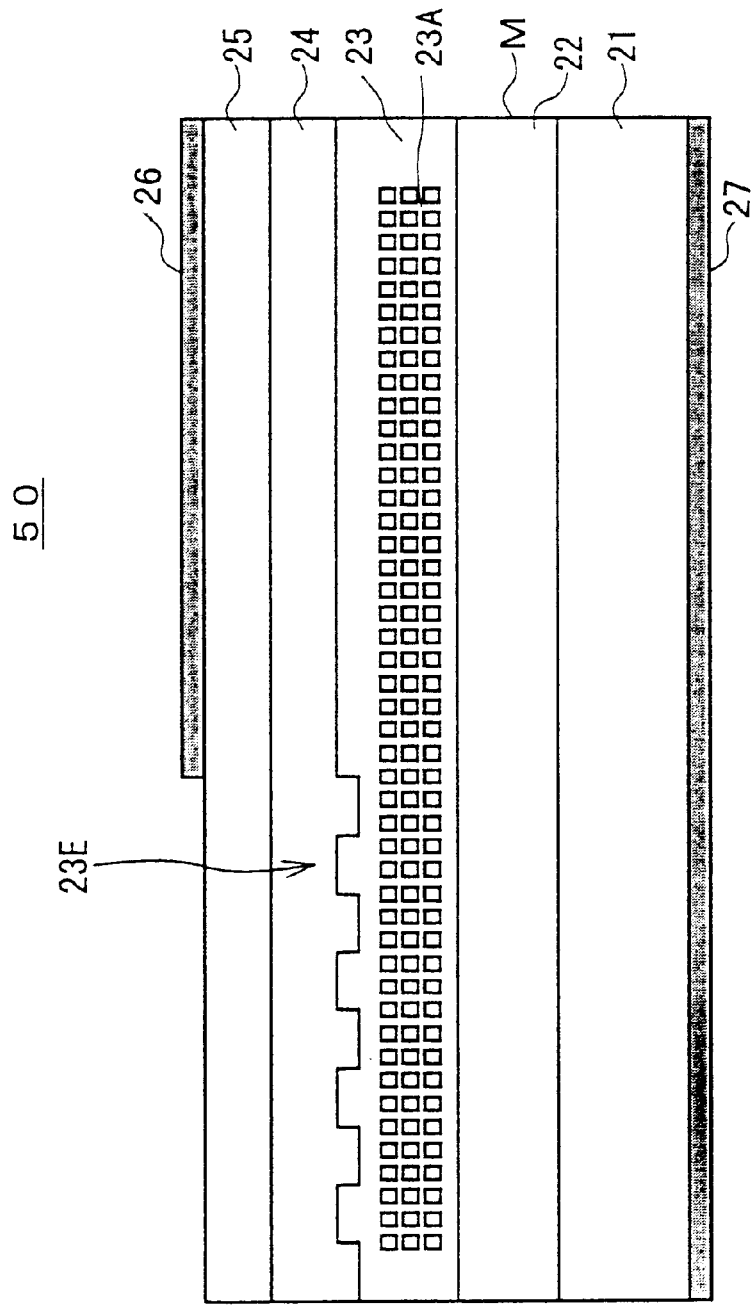
FIG. 16 is a diagram illustrating a DFB laser diode of a third embodiment of the present invention.

FIG. 16 is a diagram illustrating a DFB laser diode 50 of a third embodiment of the present invention. In FIG. 16, those elements described above are accompanied by same reference numerals and will not be explained in detail.

Referring to FIG. 16, in the present embodiment, the diffraction grating 23C formed on the GaAs SCH layer 23 so as to correspond to the electrode 26, or, formed corresponding to the carrier injection region is removed from the structure of the DFB laser diode 30 of FIG. 5. In stead, a different diffraction grating 23 E is formed at an extended part of the GaAs layer 23. The extended part of the SCH layer 23 forms a DBR and also forms an optical resonator together with a mirror surface M formed on the opposite end of the laser diode 50.

The present invention may also be applied to the DBR laser diode 50. When the resonating wavelength, or, the Bragg wavelength λg of the DBR is set such that the Bragg wavelength energy satisfies a predetermined relationship with the FWHM Γ of the gain spectrum of the active layer 23A, the absolute value of the line-width enhancement factor α may be restricted in a desired range. For example, when the FWHM is 40 meV, the pitch of the diffraction grating 23E may be set such that the Bragg wavelength energy is with in the energy width ΔE given by an equation ΔE=0.3Γ, so that the line-width enhancement factor α is restricted to a value less than or equal to 1.0.

Also, when the quantum dots 23A are formed such that the FWHM Γ is greater than 6 meV or 9 meV, the laser diode 50 can maintain a stable oscillation even if there is a temperature change of 80° C.

Further, the present invention is not limited to these embodiments, and variations and modifications may be made without departing from the scope of the present invention.

The present application is based on Japanese priority application No. 2000-356008 filed on Nov. 22, 2000, the entire contents of which are hereby incorporated by reference.

What is claimed is:

1. A laser diode comprising:
   a substrate having a first conductive type;
   a first cladding layer having a first conductive type and formed on said substrate;
   an active layer including a plurality of quantum dots and formed on said first cladding layer;
   a diffraction grating having a Bragg wavelength of λg and formed on said active layer;
   a second cladding layer having a second conductive type and formed on said active layer;
   a first electrode for injecting carriers having a first polarity into said active layer via said substrate; and
   a second electrode for injecting carriers having a second polarity into said active layer via said second cladding layer,
   wherein said diffraction grating has a pitch satisfying the following equation:

$$\Delta E \leq 1.1\Gamma$$

where Γ is the full width at half maximum (FWHM) of the gain spectrum of said active layer and ΔE an amount of an energy width corresponding to said Bragg wavelength λg from the center wavelength energy of said gain spectrum.

2. The laser diode as claimed in claim 1 wherein said diffraction grating has a pitch satisfying the following equation:

$$\Delta E \leq 0.6\Gamma$$

where Γ is the full width at half maximum (FWHM) of the gain spectrum of said active layer and ΔE an amount of an energy width corresponding to said Bragg wavelength λg from the center wavelength energy of said gain spectrum.

3. The laser diode as claimed in claim 1 wherein said diffraction grating has a pitch satisfying the following equation:

$$\Delta E \leq 0.5\Gamma$$

where Γ is the full width at half maximum (FWHM) of the gain spectrum of said active layer and ΔE an amount of an energy width corresponding to said Bragg wavelength λg from the center wavelength energy of said gain spectrum.

4. The laser diode as claimed in claim 1 wherein said diffraction grating has a pitch satisfying the following equation:

$$\Delta E \leq 0.3\Gamma$$

where Γ is the full width at half maximum (FWHM) of the gain spectrum of said active layer and ΔE an amount of an energy width corresponding to said Bragg wavelength λg from the center wavelength energy of said gain spectrum.

5. The laser diode as claimed in any one of the preceding claims, wherein said gain spectrum has the full width at half maximum (FWHM) greater than 0.15 ΔT as expressed in nanometers, where ΔT is a range of operating temperature of said DFB laser diode.

6. The laser diode as claimed in any one of claims 1 to 4, wherein said quantum dots are self-organizing quantum dots.

7. The laser diode as claimed in any one of claims 1 to 4, wherein said quantum dots have a composition consisting of InAs, and said laser diode oscillates at a 1.3 μm band or at a 1.55 μm band.

8. The laser diode as claimed in any one of claims 1–4, wherein said diffraction grating is formed on said active layer at locations corresponding to said quantum dots.

9. The laser diode as claimed in any one of claims 1–4, wherein said diffraction grating is formed in said active layer at locations where said quantum dots are formed.

10. The laser diode as claimed in any one of claims 1–4, wherein said diffraction grating is formed on said active layer at locations offset from locations where carriers are injected.

* * * * *